(12) United States Patent
Ohtsuki

(10) Patent No.: US 6,399,974 B1
(45) Date of Patent: Jun. 4, 2002

(54) SEMICONDUCTOR MEMORY DEVICE USING AN INSULATOR FILM FOR THE CAPACITOR OF THE MEMORY CELL AND METHOD FOR MANUFACTURING THE SAME

(75) Inventor: Sumito Ohtsuki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/441,823

(22) Filed: Nov. 17, 1999

(30) Foreign Application Priority Data

Nov. 17, 1998 (JP) .......................................... 10-326535

(51) Int. Cl.[7] .......................................... H01L 27/108
(52) U.S. Cl. .................. 257/296; 257/298; 257/306; 257/307; 257/310; 257/311; 257/532
(58) Field of Search ................. 257/296, 298, 257/306, 307, 310, 311, 532

(56) References Cited

U.S. PATENT DOCUMENTS 5,652,446 A * 7/1997 Sakao .......................... 257/310
5,935,766 A * 8/1999 Cheek et al. ................ 430/316
6,014,049 A * 8/2000 Solayappan et al. ........ 257/295

FOREIGN PATENT DOCUMENTS

JP 10-178155 A * 6/1998 ........... H01L/27/10
JP 11017124      1/1999

* cited by examiner

Primary Examiner—Eddie Lee
Assistant Examiner—Matthew E. Warren
(74) Attorney, Agent, or Firm—Hogan & Hartson, L.L.P.

(57) ABSTRACT

There are provided a semiconductor device a semiconductor device capable of preventing the deterioration of characteristics of a capacitor of a stacked semiconductor memory device using a ferroelectric or high-dielectric film for the capacitor of the memory cell thereof, without preventing the scale down for high density integration, and a method for manufacturing the same. A semiconductor device according to the present invention includes a first interlayer insulator film formed as one of a plurality of layers stacked on a semiconductor substrate; a capacitor formed on the first interlayer insulator film, the capacitor having a capacitor bottom electrode, a capacitor top electrode and a capacitor insulator film arranged between the capacitor bottom electrode and the capacitor top electrode; a second interlayer insulator film formed on the first interlayer insulator film, on which the capacitor is formed, the second interlayer insulator film having a surface which has the same level as that of a surface of the capacitor top electrode.

42 Claims, 7 Drawing Sheets

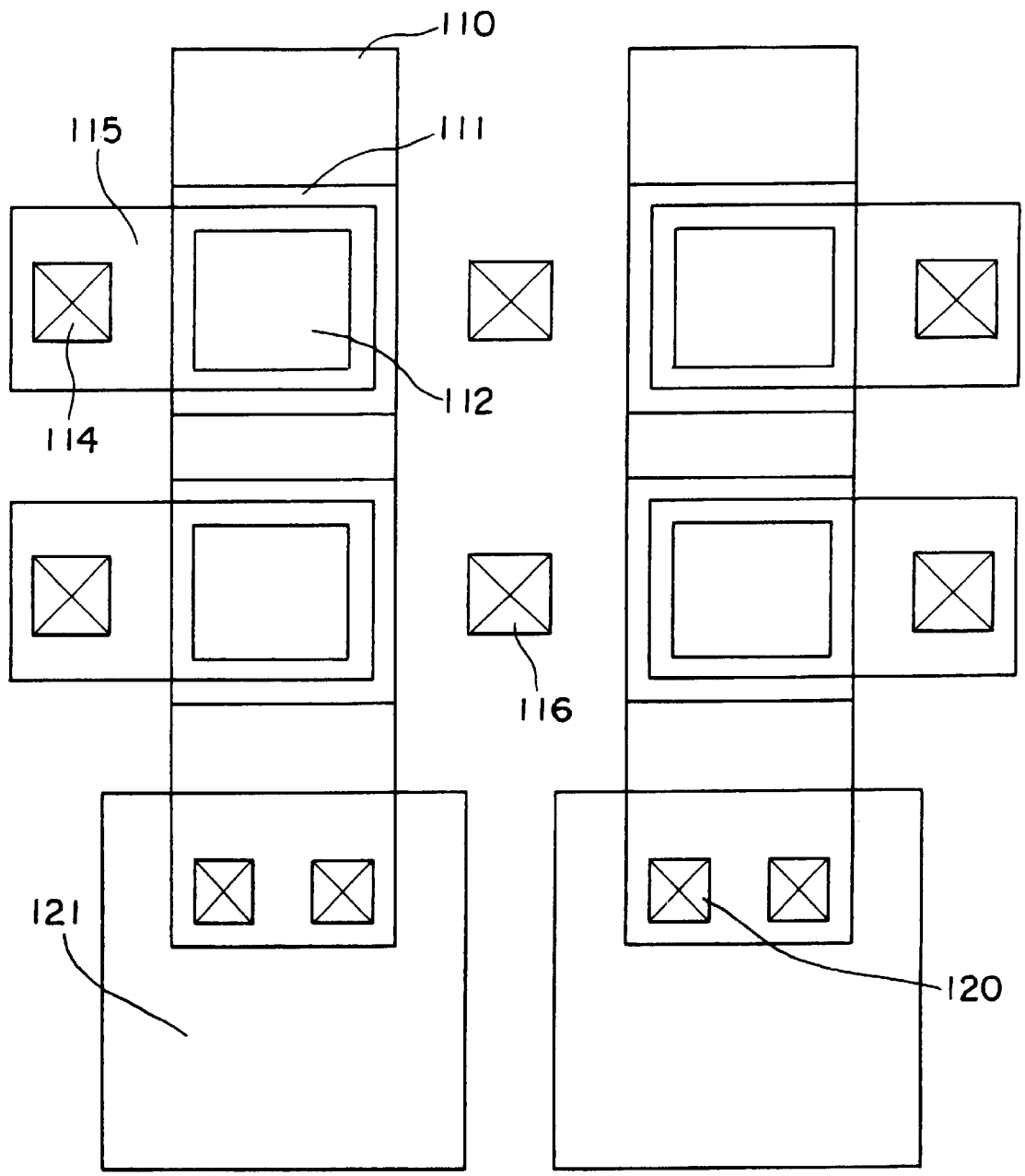
F I G. 2

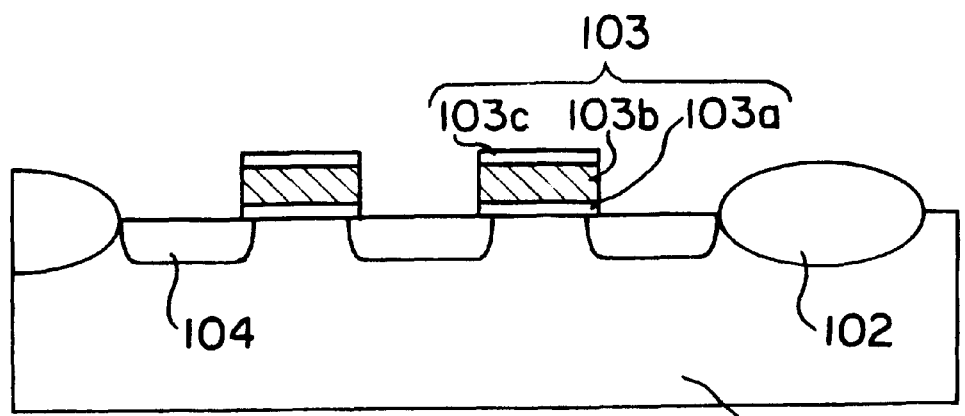
F I G. 3
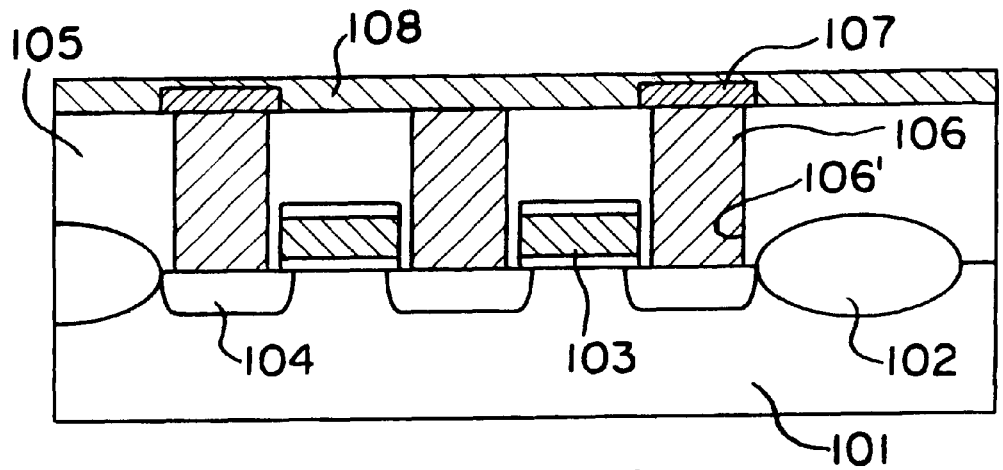
F I G. 4
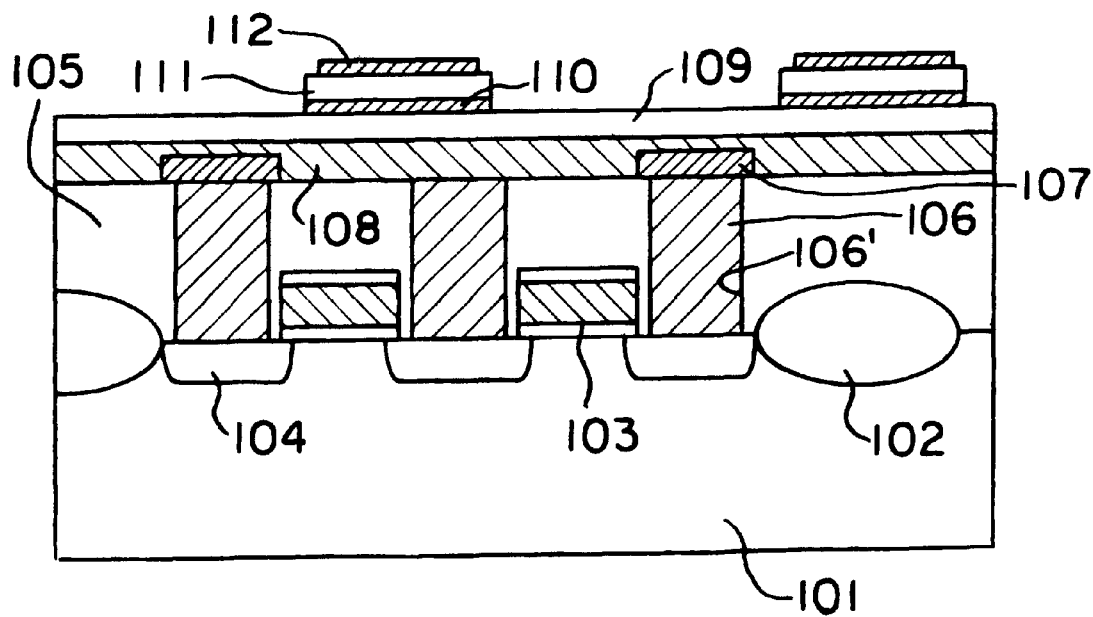
F I G. 5

SEMICONDUCTOR MEMORY DEVICE USING AN INSULATOR FILM FOR THE CAPACITOR OF THE MEMORY CELL AND METHOD FOR MANUFACTURING THE SAME

BACKGROUND OF THE ION

1. Field of the Invention

The present invention relates generally to a semiconductor dev ice and a method for manufacturing the same. More specifically, the i nvention relates to a stacked semiconductor memory device using a ferr oelectric or a high-dielectric (high-ε material (ε: permittivity)) film for a capacitor of a memory cell, and a method for manufacturing t he same.

2. Description of the Prior Art

FIG. 9 is a sectional view of a structure of a memory cell of a conventional stacked semiconductor memory device using a ferroelectric or high-dielectric film for a capacitor.

In the surface part of a silicon substrate 1, an element isolating film 2 for isolating element regions is formed every one memory cell, and three gate diffusion layers 4 are formed at regular intervals every one memory cell. On each of portions serving as channel regions between adjacent two of the gate diffusion layers 4 of the silicon substrate 1, a gate 3 of each of MOS transistors is formed so that the end portion of the gate 3 overlaps with the gate diffusion layers 4 arranged on both sides. A first interlayer insulator film 5 is formed on the silicon substrate 1, on which the gates 3 have been formed. A first contact holes 6' is formed in the first interlayer insulator film 5 above each of the gate diffusion layers 4. In each of the first contact holes 6', a first contact interconnection layer 6 is formed.

For each memory cell, a second interconnection layer 8 is connected to one of the three gate diffusion layers 4, which is commonly used for two of the MOS transistors, via one of the first contact interconnection layers 6, and a first interconnection layer 7 is connected to each of two of the gate diffusion layers 4, each of which is dedicated for a corresponding one of two of the MOS transistors, via one of the first contact interconnection layers 6. A second interlayer insulator film 9 is formed on the first interlayer insulator film 5, on which the first interconnection layer 7 and the second interconnection layer 8 have been formed. On the second interlayer insulator film 9, there are formed capacitors, each of which has a capacitor bottom electrode 10, a capacitor insulator film 11 and a capacitor top electrode 12, so that each of the capacitors corresponds to each of two of the three gate diffusion layers 4, each of which is dedicated for a corresponding one of two of the MOS transistors.

A third interlayer insulator film 13 is formed on the second interlayer insulator film 9, on which the capacitors have been formed. In order to connect the third interconnection layer 7 to the capacitor top electrode 12, a second contact hole 14' is formed in portion of the second interlayer insulator film 9 and the third interlayer insulator film 13 above each of the first interconnection layers 7, and a third contact hole 15 is formed in a portion of the third interlayer insulator film 13 above each of the capacitors. A second contact interconnection layer 14 is formed in each of the second contact holes 14', and a third contact interconnection layer 15 is formed in the third contact hole 15'. A third interconnection layer 16 of a multilayer interconnection layer is formed on the third interlayer insulator film 13 for connecting the first interconnection layer 7 to the capacitor top electrode 12 via the second contact interconnection layer 14 and the third contact interconnection layer 15. Moreover, an interconnection protecting insulator film 17 is formed on the whole surface of the third interlayer insulator film 13, on which the third interconnection layer 16 has been formed.

The above-described stacked semiconductor memory device functions as a non-volatile memory, such as an EPROM and an EEPROM, when the capacitor insulator film 11 between the capacitor bottom electrode 10 and the capacitor top electrode 12 is formed of a ferromagnetic having a spontaneous dielectric polarization while no electric field is applied, and functions as a volatile memory, such as a DRAM, when the capacitor insulator film 11 is formed of a high-dielectric having a high dielectric.

FIGS. 10 through 12 are sectional views showing a process for manufacturing the memory cell of the conventional stacked semiconductor memory device shown in FIG. 9.

The memory cell of the conventional stacked semiconductor memory device of FIG. 9 is produced by a following manufacturing method.

First, as shown in FIG. 10, an element isolating film 2 for isolating regions is formed every one memory cell in the surface part of a silicon substrate 1 by a thermal oxidation and a photolithography so as to have a thickness of, e.g., about 5000 angstroms(1 angstrom=10 nm). Thereafter, for each one memory cell, a gate oxide film 3a of a gate 3 of a MOS transistor is formed on the silicon substrate 1 by the thermal oxidation so as to have a thickness of, e.g., about 100 angstroms. In addition, a tungsten silicide layer serving as a gate interconnection layer 3b of the gate 3 is deposited on the gate oxide film 3a by a CVD method so as to have a thickness of, e.g., about 2000 angstroms. Moreover, a silicon nitride film serving as a gate protecting film 3c of the gate 3 is deposited on the gate interconnection layer 3b by the CVD method so as to have a thickness of, e.g., about 1000 angstroms. After the gate oxide film 3a, the gate interconnection layer 3b and the gate protecting layer 3c are formed, two gates 3 of MOS transistors are formed every one memory cell by the photolithography and an anisotropic etching (e.g., RIE). After the gates 3 are formed, three gate diffusion layers 4 serving as sources and drains of the MOS transistors are formed every one memory cell by an ion implantation and a thermal diffusion.

Then, as shown in FIG. 11, a first interlayer insulator film 5 is deposited by the CVD method so as to have a thickness of, e.g., about 6000 angstroms. In a portion of the first interlayer insulator film 5 above each of the gate diffusion layers 4, i.e., in a portion for allowing a first contact interconnection layer 6 to be formed, a first contact hole 6' is formed by the photolithography and the RIE. After the first contact hole 6', a tungsten layer having a thickness of, e.g., about 4000 angstroms, is deposited by the CVD method so as to be embedded in the first contact hole 6', and etched to the surface of the first contact hole 6' by a isotropic etching (e.g., CDE) to form the first contact interconnection layer 6. After the first contact interconnection layer 6 is formed, a tungsten layer is deposited by the CVD method so as to have a thickness of, e.g., about 4000. Then, for each memory cell, a second interconnection layer 8, which is connected to the first contact interconnection layer 6 on one of three gate diffusion layers 4 commonly used for two of the MOS transistors, and a first interconnection layer 7, which is connected to the first contact interconnection layer 6 on each of two of the gate diffusion layers 4 dedicated for two of the MOS transistors, respectively, are formed by the photolithography and the RIE.

After the first interconnection layer 7 and the second interconnection layer 8 are formed, a second interlayer insulator film 9 is deposited by the CVD method so as to have a thickness of, e.g., about 3000 angstroms, on the first interlayer insulator film 5, on which the first interconnection layer 7 and the second interconnection layer 8 have been formed, as shown in FIG. 9. After the second interlayer insulator film 9 is deposited, a platinum (Pt) film serving as a capacitor bottom electrode 10 of a capacitor is deposited by a sputtering method so as to have a thickness of, e.g., about 2000 angstroms, and a PZT (lead (Pb) zirconate titanate) film serving as a capacitor insulator film 11 of the capacitor is deposited thereon by the sputtering method so as to have a thickness of, e.g., about 3000 angstroms. Moreover, a platinum film serving as a capacitor top electrode 12 of the capacitor is deposited thereon by the sputtering method so as to have a thickness of, e.g., about 2000 angstroms. After the platinum film, the PZT film and the platinum film are sequentially formed, the capacitor top electrode 12 is formed by the photolithography and the RIE. Thereafter, the capacitor insulator film 11 and the capacitor bottom electrode 10 are formed by the photolithography and the RIE.

After the capacitor having the capacitor top electrode 12, the capacitor insulator film 11 and the capacitor bottom electrode 10 is formed, a third interlayer insulator film 13 is deposited on the second interlayer insulator film 9, on which the capacitor has been formed, by the CVD method so as to have a thickness of, e.g., about 6000 angstroms, as shown in FIG. 9. After the third interlayer insulator film 13 is deposited, a second contact hole 14' is formed in a portion of the third interlayer insulator film 13 above the first interconnection layer 7 by the photolithography and the RIE. Moreover, a third contact hole 15' is formed in a portion of the third interlayer insulator film 13 above the capacitor top electrode 12 by the photolithography and the RIE. After the second contact hole 14' and the third contact hole 15' are formed, an aluminum layer having a thickness of, e.g., about 40 angstroms, is deposited by the sputtering method so as to be embedded in the second contact hole 14' and the third contact hole 15'. After the aluminum layer is deposited, the deposited aluminum layer is processed by the photolithography and the RIE so as to form a second contact interconnection layer 14 in the second contact hole 14', a third contact interconnection layer 15 in the third contact hole 15', and a third interconnection layer 16 of a multilayer interconnection layer on the third interlayer insulator film 13. Thereafter, an interconnection protecting insulator film 17 is deposited on the third interlayer insulator film 13, on which the third interconnection layer 16 has been formed, by the CVD so as to have a thickness of, e.g., about 6000 angstroms. Thus, the conventional memory cell of the stacked semiconductor memory device shown in FIG. 9 is completed.

However, in the above-described conventional memory cell of the stacked semiconductor memory device using the ferroelectric or high-dielectric film for the capacitor and in the method for manufacturing the same, there is the following problem. That is, there may be a problem in that the adverse influence of the etching remarkably deteriorates characteristics of the capacitor. More specifically, the adverse influence of the etching, particularly the RIE, for forming the third contact hole 15' for establishing the contact connection to the capacitor top electrode 12 using the metal interconnection (the third contact interconnection layer 15) after forming the capacitor, and the adverse influence of the reduced atmosphere in the process for forming the multi-layer interconnection layer (the third interconnection layer 16) after forming the capacitor, remarkably deteriorate characteristics, such as charge holding characteristic and reliability, of the capacitor.

On the other hand, if the etching for forming the third contact hole 15' is carried out by the CDE in order to establish the contact connection to the capacitor top electrode using the metal interconnection layer, the adverse influence on the capacitor is decreased. However, since the contact opening portion is wide, if the capacitor top electrode 12 is small, etching proceeds to the vicinity of the capacitor insulator film 11, so that it is difficult to form the third contact hole 15'. Therefore, when the third contact hole 15' is formed by the isotropic etching, the capacitor top electrode 12 must be sufficiently large, so that the scale down for high density integration is prevented.

SUMMARY OF THE INVENTION

It is therefore an object of the present invention to provide a semiconductor device of capable of preventing the deterioration of characteristics, such as charge holding characteristic and reliability, of a capacitor of a memory cell of a stacked semiconductor memory device using a ferroelectric or high-dielectric film for the capacitor, without preventing the scale down for high density integration.

It is another object of the present invention to provide a method for manufacturing such a semiconductor device.

According to one aspect of the present invention, there is provided a semiconductor device comprising a first interlayer insulator film formed as one of a plurality of layers stacked on a semiconductor substrate; a capacitor formed on said first interlayer insulator film, said capacitor having a capacitor bottom electrode, a capacitor top electrode and a capacitor insulator film arranged between said capacitor bottom electrode and said capacitor top electrode; a second interlayer insulator film formed on said first interlayer insulator film, on which said capacitor is formed, said second interlayer insulator film having a surface which has the same level as that of a surface of said capacitor top electrode.

According to the above-described semiconductor device, the surface of the capacitor top electrode, such as the top electrode of a stacked high-dielectric capacitor, may be exposed at the same time that the interlayer insulator film formed on the top electrode is flattened. Thus, it is possible to easily establish the electrical connection to the electrode of the capacitor. In addition, since no interlayer insulator film exists in the connection part on the electrode of the capacitor, it is possible to decrease the thickness of the stacked capacitor, which tends to increase the thickness of the device, and it is possible to decrease the difference in level caused by processing. In addition, the surface of the top electrode of the stacked high-dielectric capacitor may be used as a stopper to flatten the interlayer insulator film on the capacitor top electrode. Thus, it is possible to easily detect the processing end particularly when a chemical mechanical polishing (CMP) is used, and it is possible to form an interconnection connection layer on the whole of the capacitor top electrode. Therefore, the processing margin for forming a contact interconnection layer to the capacitor top electrode by the photolithography can be larger than that for forming only by a contact hole and a contact interconnection layer, and the process can also be simplified. Moreover, since the surface of the capacitor top electrode exposed by the flattening of the interlayer insulator film on the capacitor top electrode has substantially the same level as that of the surface of the interlayer insulator film, it is possible to improve the processing margin in the photolithography while improving the controllability of processing particularly in a step of forming a multilayer above the capacitor top electrode.

According to the present invention, since the surface of the top electrode of the stacked high-dielectric capacitor may be exposed at the same time that the interlayer insulator film formed on the top electrode is flattened, it is possible to easily establish the electrical connection to the electrode of the capacitor. In particular, it is possible to reduce the deterioration of characteristics of a ferroelectric capacitor which tends to be under the adverse influence of the anisotropic etching. In addition, since the surface of the top electrode of the stacked high-dielectric capacitor may be used as a stopper to flatten the interlayer insulator film on the capacitor top electrode, it is possible to easily detect a processing end, and it is possible to decrease the thickness of the capacitor top electrode and the total thickness of the interlayer insulator films on the capacitor top electrode.

In addition, according to the present invention, since the interlayer insulator film below the capacitor bottom electrode of the stacked ferroelectric capacitor may be flattened and since the surface of the capacitor top electrode may be used as a stopper to flatten the interlayer insulator film on the capacitor top electrode, the surface of the capacitor top electrode exposed by the flattening of the interlayer insulator film on the capacitor top electrode has substantially the same level as that of the surface of the interlayer insulator film. Therefore, in a step of forming a multilayer above the capacitor top electrode, it is possible to improve the processing margin in the photolithography while improving the controllability of processing, and it is possible to easily process layers formed above and below the capacitor electrodes, so that it is possible to reduce the adverse influence on the ferroelectric capacitor insulator film due to excessive etching in the multilayering step including the capacitor electrode forming step.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the attached drawings:

FIG. 2 is a plan view showing the structure of the first preferred embodiment of a semiconductor device according to the present invention;

FIG. 3 is the first sectional view showing a manufacturing step of a method for manufacturing the first preferred embodiment of a semiconductor device according to the present invention;

FIG. 4 is the second sectional view showing a manufacturing step of a method for manufacturing the first preferred embodiment of a semiconductor device according to the present invention;

FIG. 5 is the third sectional view showing a manufacturing step of a method for manufacturing the first preferred embodiment of a semiconductor device according to the present invention;

DESCRIPTION OF THE PREFERRED EMBODIMENTS

Referring now to the accompanying drawings, the preferred embodiments of a semiconductor device and a method for manufacturing the same, according to the present invention, will be described below.

Figure 1:
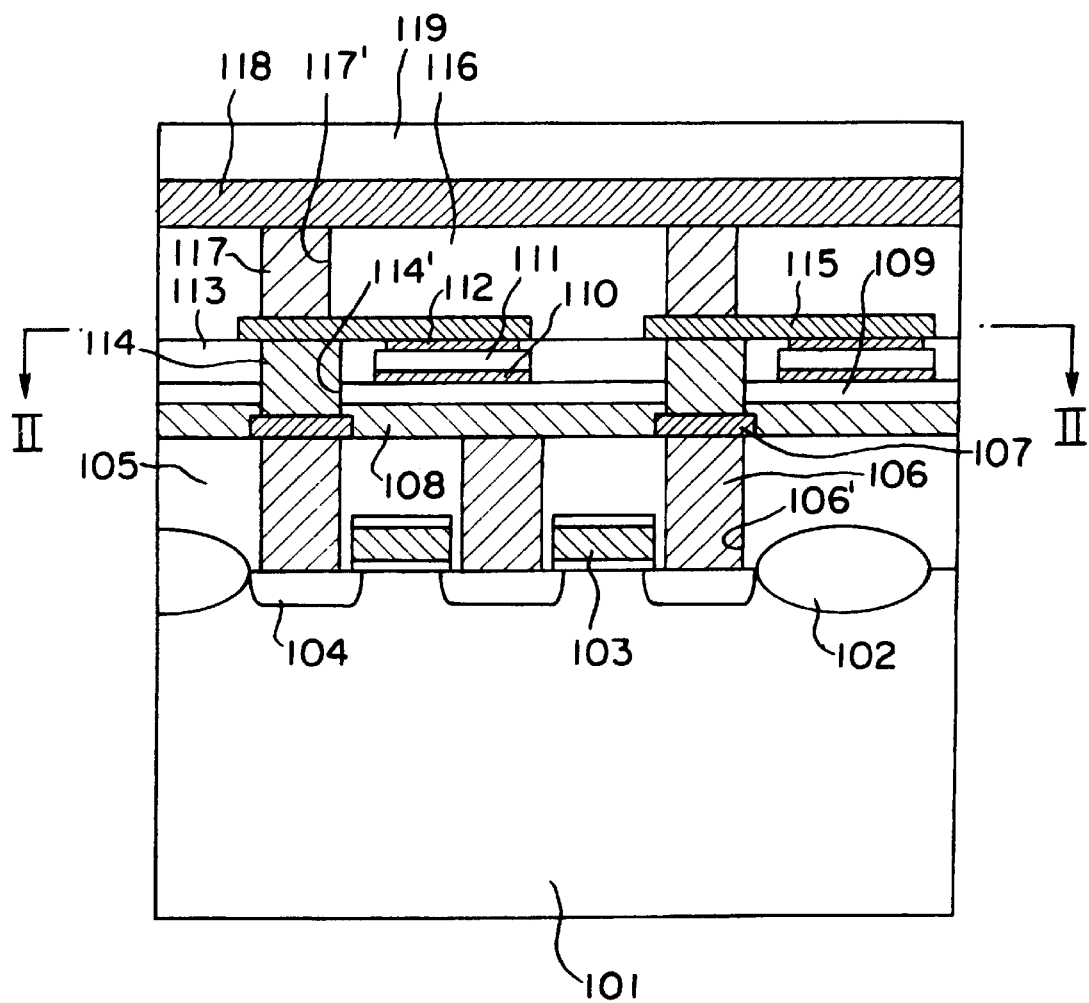
FIG. 1 is a sectional view, taken along line II—II of FIG. 2, showing the structure of the first preferred embodiment of a semiconductor device according to the present invention.

FIG. 1 is a sectional view, taken along line II—II of FIG. 2, showing the structure of the first preferred embodiment of a semiconductor device according to the present invention. Specifically, FIG. 1 is a sectional view showing the structure of the first preferred embodiment of a memory cell of a stacked semiconductor memory device using a ferroelectric or high-dielectric film for a capacitor, according to the present invention. FIG. 2 is a plan view showing the structure of the first preferred embodiment of a semiconductor device according to the present invention.

In the surface part of a silicon substrate 101, an element isolating film 102 for isolating element regions is formed every one memory cell, and three gate diffusion layers 104 are formed at regular intervals every one memory cell. On each of portions serving as channel regions between adjacent two of the gate diffusion layers 104 of the silicon substrate 101, the gate 103 of each of MOS transistors is formed so that the end portion of the gate 103 overlaps with the gate diffusion layers 104 arranged on both sides. A first interlayer insulator film 105 is formed on the silicon substrate 101, on which the gates 103 have been formed. A first contact holes 106' is formed in the first interlayer insulator film 105 above each of the gate diffusion layers 104. In each of the first contact holes 106', a first contact interconnection layer 106 is formed.

For each memory cell, a second interconnection layer 108 is connected to one of the three gate diffusion layers 104, which is commonly used for two of the MOS transistors, via a corresponding one of the first interconnection layers 106, and a first interconnection layer 107 is connected to each of two of the gate diffusion layers 104, each of which is dedicated for a corresponding one of two of the MOS transistors, via a corresponding one of the first interconnection layers 106. A second interlayer insulator film 109 is formed on the first interlayer insulator film 105, on which the first interconnection layer 107 and the second interconnection layer 108 have been formed. On the second interlayer:insulator film 109, there are formed capacitors, each of which has a capacitor bottom electrode 110, a capacitor insulator film 111 and a capacitor top electrode 112, so that each of the capacitors corresponds to each of two of the three gate diffusion layers 104, each of which is dedicated for a corresponding one of two of the MS transistors. The capacitor bottom electrode 110 is connected to a circuit interconnection layer 121, which is connected to a circuit part, via an electrode drawing contact interconnection 120. Furthermore, one or both of the capacitor bottom electrode 110 and the capacitor top electrode 112 may have a stacked structure.

A third interlayer insulator film 113 is formed on the second interlayer insulator film 109, on which the capacitors have been formed. On the surface of the third interlayer insulator film 113, the surface of the capacitor top electrode 112 is exposed. The surface of the third interlayer insulator film 113 is flattened so as to have substantially the same level as that of the surface of the capacitor top electrode 112. In addition, in order to connect the third interconnection layer 107 to the capacitor top electrode 112, a second contact hole 114' is formed in portions of the second interlayer insulator film 109 and the third interlayer insulator film 113 above each of the first interconnection layers 107. In each of the second contact holes 114', a second contact interconnection layer 114 is formed. A third contact interconnection layer 115 is formed on the third interlayer insulator film 113 for connecting the first interconnection layer 107 to the capacitor top electrode 112 via the second contact interconnection layer 114. The third contact interconnection layer 115 may be formed in a portion including a part or all of a top surface of the second contact interconnection layer 114 on the third interlayer insulator film 113 and a part or all of a surface of the capacitor top electrode 112. That is, the third contact interconnection layer 115 may have a cross-sectional width which is equal to the maximum distance between a side of the capacitor top electrode 112 and a side of the second contact interconnection layer 114 or is longer than the maximum distance described above.

A fourth interlayer insulator film 116 is formed on the third interlayer insulator film 113, on which the third interconnection layer 115 has been formed. A third contact hole 117' is formed in a portion of the fourth interlayer insulator film 116 above each of the third interconnection layers 115. In each of the third contact holes 117', a third contact interconnection layer 117 is formed. A fourth interconnection layer 118 of a multilayer interconnection layer is formed on the fourth interlayer insulator film 116, on which the third contact interconnection layer 117 has been formed. Moreover, an interconnection protecting insulator film 119 is formed on the whole surface of the fourth interlayer insulator film 116, on which the fourth interconnection layer 118 has been formed.

Similar to the conventional stacked semiconductor memory device, the first preferred embodiment of a stacked semiconductor memory device according to the present invention, which is shown in FIG. 1, functions as a non-volatile memory, such as an EPROM and an EEPROM, when the capacitor insulator film 111 between the capacitor bottom electrode 110 and the capacitor top electrode 112 is formed of a ferromagnetic having a spontaneous dielectric polarization while no electric field is applied, and functions as a volatile memory, such as a DRAM, when the capacitor insulator film 111 is formed of a high-dielectric having a high dielectric.

FIGS. 3 through 7 are sectional views showing manufacturing steps of a method for manufacturing the first preferred embodiment of a memory cell of a semiconductor device according to the present invention. Specifically, FIGS. 3 through 7 are sectional views showing manufacturing steps of a process for manufacturing the first preferred embodiment of a memory cell of a stacked semiconductor memory device, according to the present invention, which is shown in FIGS. 1 and 2.

The first preferred embodiment of a memory cell of a stacked semiconductor memory device according to the present invention, which is shown in FIGS. 1 and 2, is produced by the following first preferred embodiment of a method for manufacturing a semiconductor device according to the present invention.

First, as shown in FIG. 3, an element isolating film 102 for isolating regions is formed every one memory cell in the surface part of a silicon substrate 101 by a thermal oxidation and a photolithography so as to have a thickness of, e.g., about 5000 angstroms. Thereafter, for each one memory cell, a gate oxide film 103a of a gate 3 of a MOS transistor is formed on the silicon substrate 101 by the thermal oxidation so as to have a thickness of, e.g., about 100 angstroms. In addition, a tungsten silicide layer serving as a gate interconnection layer 103b of the gate 103 is deposited on the gate oxide film 103a by a CVD method so as to have a thickness of, e.g., about 2000 angstroms. Moreover, a silicon nitride film serving as a gate protecting film 103c of the gate 103 is deposited on the gate interconnection layer 103b by the CVD method so as to have a thickness of, e.g., about 1000 angstroms. After the gate oxide film 103a, the gate interconnection layer 103b and the gate protecting layer 103c are formed, two gates 103 of MOS transistors are formed every one memory cell by the photolithography and a RIE. After the gates 103 are formed, three gate diffusion layers 104 serving as sources and drains of the MOS transistors are formed every one memory cell by an ion implantation and a thermal diffusion.

Then, as shown in FIG. 4, a first interlayer insulator film 105 is deposited by the CVD method so as to have a thickness of, e.g., about 6000 angstroms. In a portion of the first interlayer insulator film 105 above each of the gate diffusion layers 104, i.e., in a portion for allowing a first contact interconnection layer 106 to be formed, a first contact hole 106' is formed by the photolithography and the RIE. After the first contact hole 106', a tungsten layer having a thickness of, e.g., about 4000 angstroms, is deposited by the CVD method so as to be embedded in the first contact hole 106', and etched to the surface of the first contact hole 106' by a CDE to form the first contact interconnection layer 106. After the first contact interconnection layer 106 is formed, a tungsten layer is deposited by the CVD method so as to have a thickness of, e.g., about 4000 angstroms. For each memory cell, a second interconnection layer 108, which is connected to the first contact interconnection layer 106 on one of three gate diffusion layers 104 commonly used for two of the MOS transistors, and a first interconnection layer 107, which is connected to the first contact interconnection layer 106 on each of two of the gate diffusion layers 104 dedicated for two of the MOS transistors, respectively, are formed by the photolithography and the RIE.

After the first interconnection layer 107 and the second interconnection layer 108 are formed, a second interlayer insulator film 109 is deposited by the CVD method so as to have a thickness of, e.g., about 3000 angstroms, on the first interlayer insulator film 105, on which the first interconnection layer 107 and the second interconnection layer 108 have been formed, as shown in FIG. 5. After the second interlayer insulator film 109 is deposited, a platinum film serving as a capacitor bottom electrode 110 is deposited by a sputtering method so as to have a thickness of, e.g., about 2000 angstroms, and a PZT film serving as a capacitor insulator film 111 is deposited thereon by the sputtering method so as to have a thickness of, e.g., about 3000 angstroms. Moreover, a platinum film serving as a capacitor top electrode 112 is deposited thereon by the sputtering method so as to have a thickness of, e.g., about 2000 angstroms. Furthermore, when the capacitor bottom electrode 110 and the capacitor top electrode 112 have a stacked structure, an SRO (strontium ruthenium oxide) layer or a ruthenium layer is deposited after platinum film serving as the capacitor bottom electrode 110 is deposited, and an SRO layer or a ruthenium layer is deposited after the PZT film serving as the capacitor insulator film 111 is deposited. After the platinum film, the PZT film and the platinum film are sequentially formed, the capacitor top electrode 112 is formed by the photolithography and the RIE. Thereafter, the capacitor insulator film 111 and the capacitor bottom electrode 110 are formed by the photolithography and the RIE.

Figure 6:
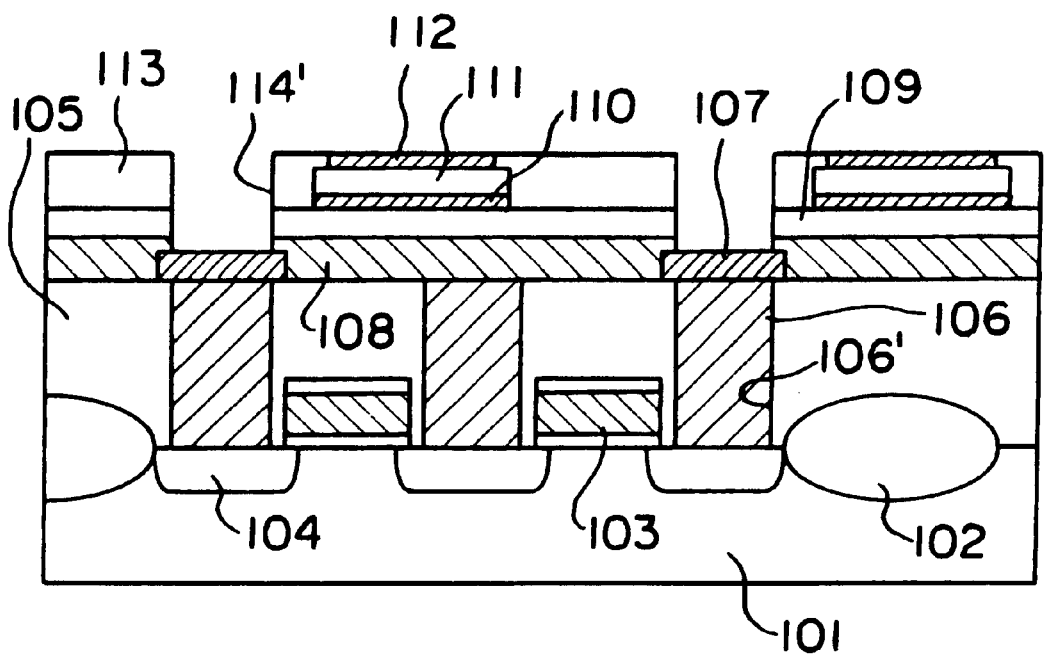
FIG. 6 is the fourth sectional view showing a manufacturing step of a method for manufacturing the first preferred embodiment of a semiconductor device according to the present invention.
Figure 7:
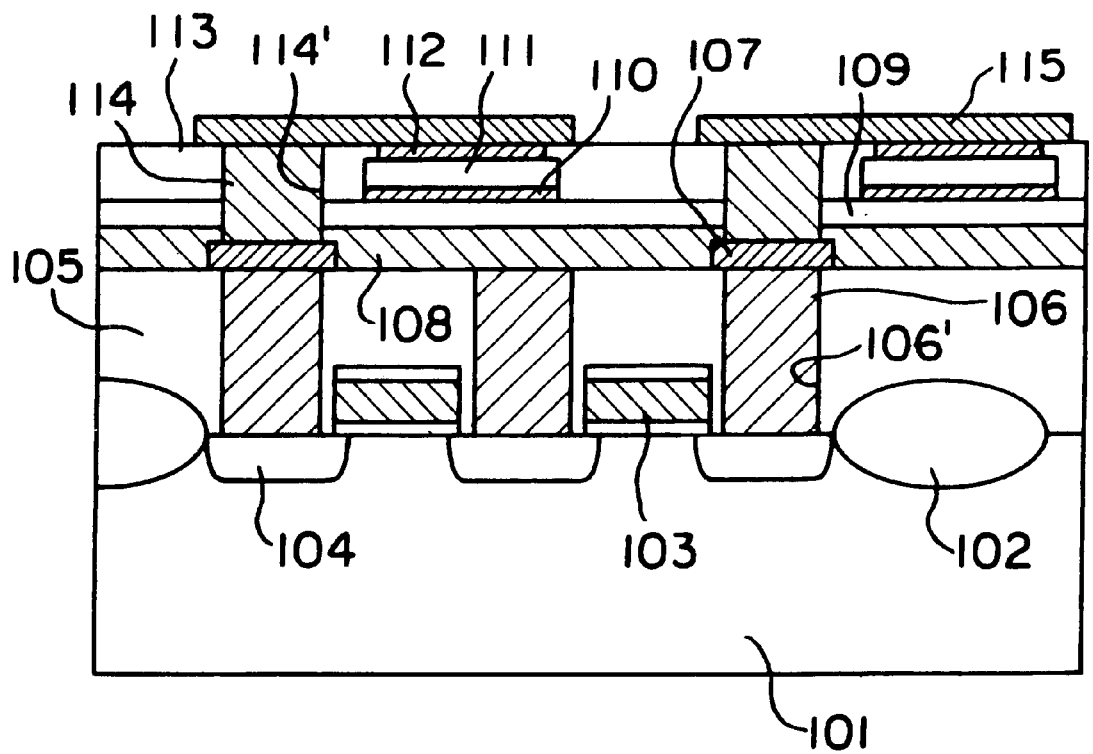
FIG. 7 is the fifth sectional view showing a manufacturing step of a method for manufacturing the first preferred e oddment of a semiconductor device according to the present invention.

After the capacitor having the capacitor top electrode 112, the capacitor insulator film 111 and the capacitor bottom electrode 110 is formed, a third interlayer insulator film 113 is deposited on the second interlayer insulator film 109, on which the capacitor has been formed, by the CVD method so as to have a thickness of, e.g., about 6000 angstroms, as shown in FIG. 6. After the third interlayer insulator film 113 is deposited, the surface of the third interlayer insulator film 113 is flattened by, e.g., the CMP using the capacitor top electrode 112 as a stopper, so as to have substantially the same level as that of the surface of the capacitor top electrode 112 to expose the surface of the capacitor top electrode 112. Furthermore, although the flattening of the surface of the third interlayer insulator film 113 is preferably carried out by only the CMP, the flattening may be carried out by the combination of the CMP and etching. That is, after the flattening is carried out by the CMP until the third interlayer insulator film 113 slightly r on the capacitor top electrode 112, the third interlayer insulator film 113 remaining on the capacitor top electrode 112 may be etched to be removed to expose the surface of the capacitor top electrode 112. In this case, the etching is more preferably the wet etching than the dry etching in view of the influence on the characteristics of the capacitor. After the surface of the third interlayer insulator film 113 is flattened, a second contact hole 114' is formed in a portion of the third interlayer insulator film 113 above the first interconnection layer 107 by the photolithography and the RIE.

After the second contact hole 114' is formed, an aluminum layer having a thickness of, e.g., about 4000 angstroms, is deposited by the sputtering method so as to be embedded in the second contact hole 114'. After the aluminum layer is deposited, the deposited aluminum layer is processed by the photolithography and the RIE so as to form a second contact interconnection layer 114 in the second contact hole 114' and a third interconnection layer 115 on the third interlayer insulator film 113. In this case, since the surface of the capacitor top electrode 112 is exposed so that the surface of the third interlayer insulator film 113 is flattened so as to be associated with the surface of the capacitor top electrode 112 for forming the same plane without forming steps, the allowable range for alignment precision is increased to facilitate the formation and processing of the second contact interconnection layer 114, the third interconnection layer 115 and upper multilayer interconnection layers. The third contact interconnection layer 115 may be formed in a portion including a part or all of a top surface of the second contact interconnection layer 114 on the third interlayer insulator film 113 and a part or all of a surface of the capacitor top electrode 112. That is, the third contact interconnection layer 115 may have a cross-sectional width which is equal to the maximum distance between a side of the capacitor top electrode 112 and a side of the second contact interconnection layer 114 or is longer than the maximum distance described above. In this case, it is possible to decrease the contact resistance between the capacitor top electrode 112 and the third contact interconnection layer 115. Moreover, the allowable range of alignment precise in the manufacturing process can be very large.

Thereafter, as shown in FIG. 1, a fourth interlayer insulator film 116 is deposited on the third interconnection layer 115 and the third interlayer insulator film 113 by the CVD so as to have a thickness of, e.g., about 3000 angstroms, and a third contact hole 117' is formed in a portion of the fourth interlayer insulator film 116 above the third interconnection layer 115 by the photolithography and the RIE. After the third contact hole 117' is formed, aluminum having a thickness of, e.g., about 3000 angstroms, is deposited by the sputtering method so as to be embedded in the third contact hole 117'. After aluminum is deposited, a third contact interconnection layer 117 and a multilayer interconnection layer 118 are formed by the photolithography and the RIE so as to be electrically connected to the second contact interconnection layer 114. Finally, an interconnection protecting insulator film 119 is deposited thereon by the CVD so as to have a thickness of, e.g., about 8000 angstroms. Thus, the first preferred embodiment of a memory cell of a stacked semiconductor memory device according to the present invention, which is shown in FIG. 1, is completed.

As described above, in the first preferred embodiment of a semiconductor device and a method for manufacturing the same according to the present invention, the interconnection drawn from the capacitor top electrode 112 is not formed by the formation of a contact hole and the embedding of a metal interconnection by the anisotropic etching after forming a capacitor, and the interconnection layer is formed by exposing the whole surface of the capacitor top electrode 112 by the CMP, depositing the metal interconnection layer 115 thereon, and anisotropic-etching the metal interconnection layer 115. Therefore, the anisotropic etching for forming the contact hole for forming the interconnection drawn from the capacitor top electrode 112 has no adverse influence on the capacitor top electrode 112, so that it is possible to easily form the interconnection drawn from the capacitor top electrode 112 to obtain good capacitor characteristics. In addition, since the interconnection drawn from the capacitor top electrode 112 is formed without forming any contact holes, the difference in level due to contact holes in upper layers above the capacitor top electrode 112 can be removed, so that the conventional difficulty of processing the multilayer structure due to the difference in level can be reduced.

In addition, in the first preferred embodiment of a semiconductor device and a method for manufacturing the same according to the present invention, the multilayer interconnection layer is connected to the whole surface of the capacitor top electrode 112, so that the contact resistance between the capacitor top electrode 112 and the multilayer interconnection layer can be decreased. Moreover, the allowable range of alignment precise in the manufacturing process can be very large, and the difference in level due to contact holes in upper layers above the capacitor top electrode 112 can be removed, so that the processing of the interconnection can be easily carried out to be suitable for the high density integration of a semiconductor device.

Figure 8:
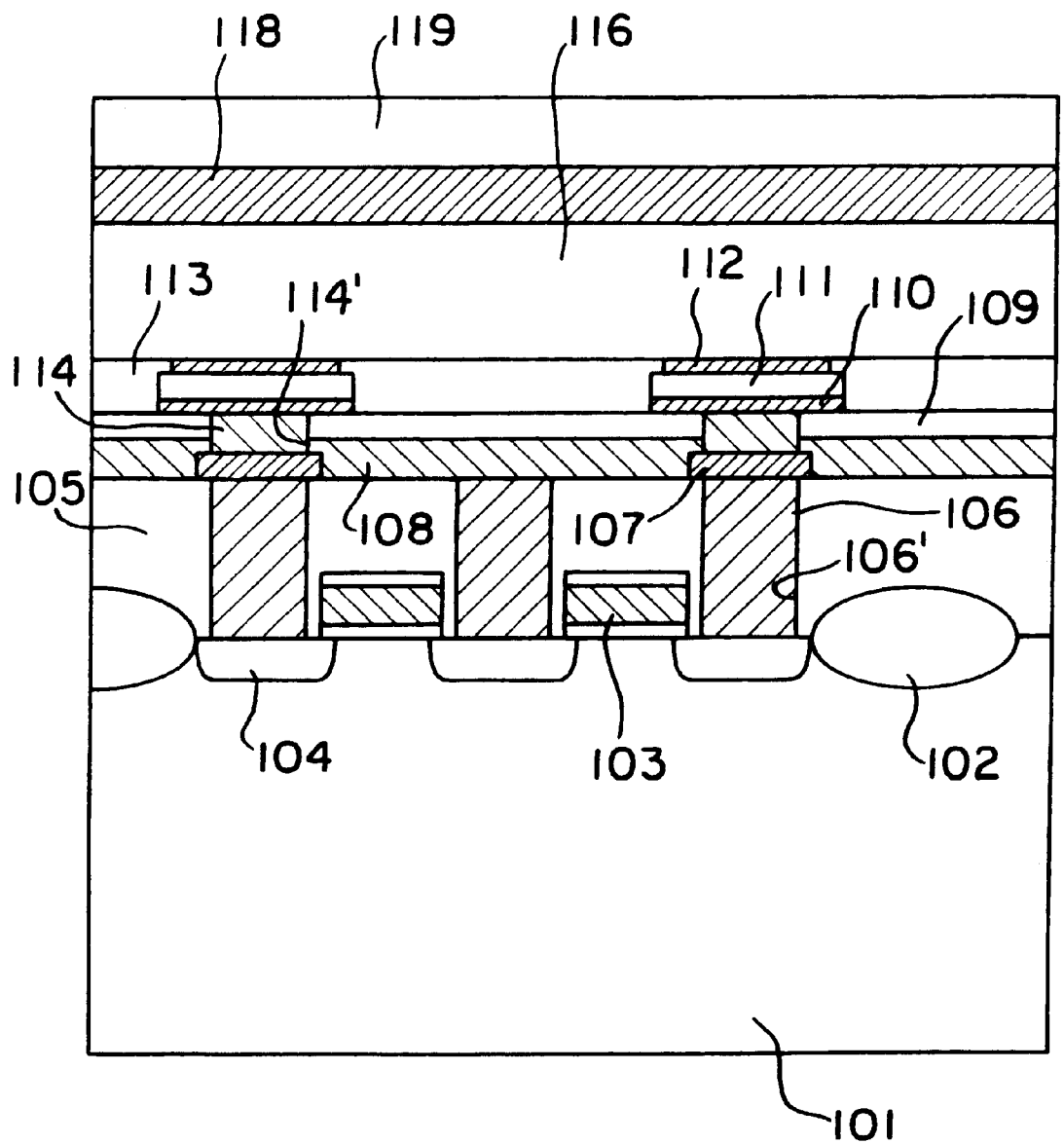
FIG. 8 is a sectional view showing the structure of the second preferred embodiment of a semiconductor device according to the present invention.
Figure 9:
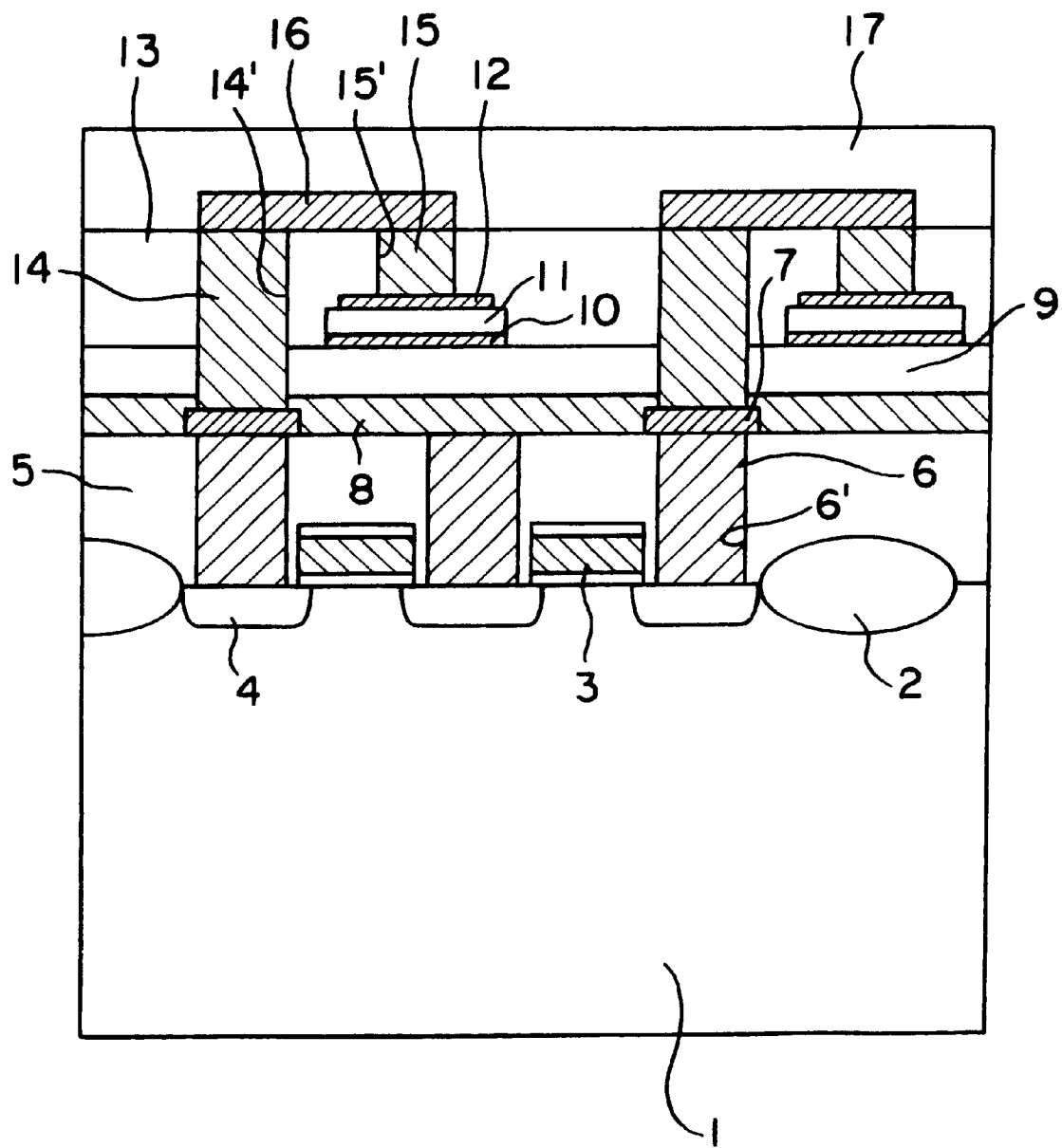
FIG. 9 is a sectional view showing the structure of a memory cell of a conventional stacked semiconductor memory device using a ferroelectric or high-dielectric film for a capacitor.
Figure 10:
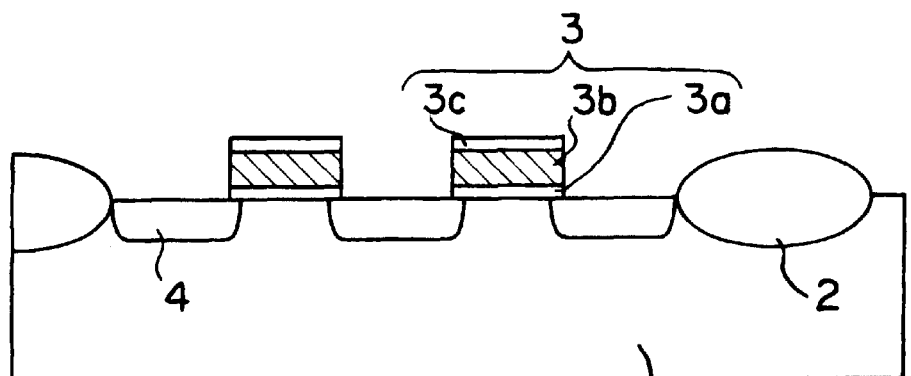
FIG. 10 is a sectional view showing a step of a process for manufacturing the memory cell of the conventional stacked semiconductor memory device of FIG. 9.
Figure 11:
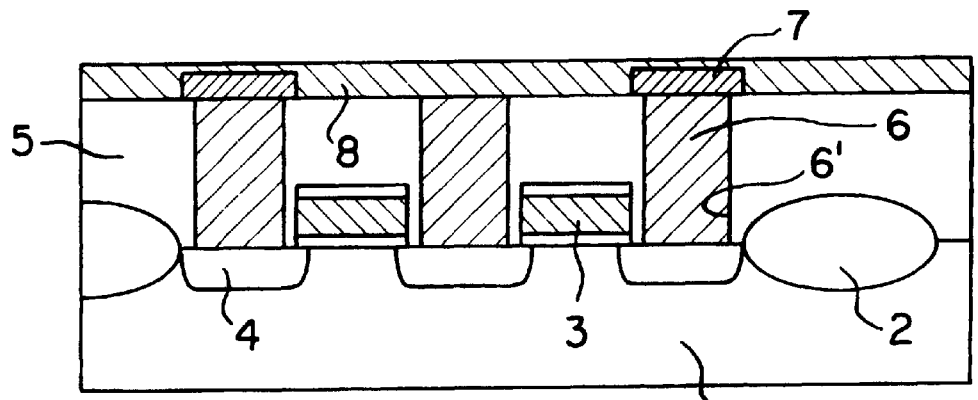
FIG. 11 is a sectional view showing a step of a process for manufacturing the memory cell of the conventional stacked semiconductor memory device of FIG. 9.
Figure 12:
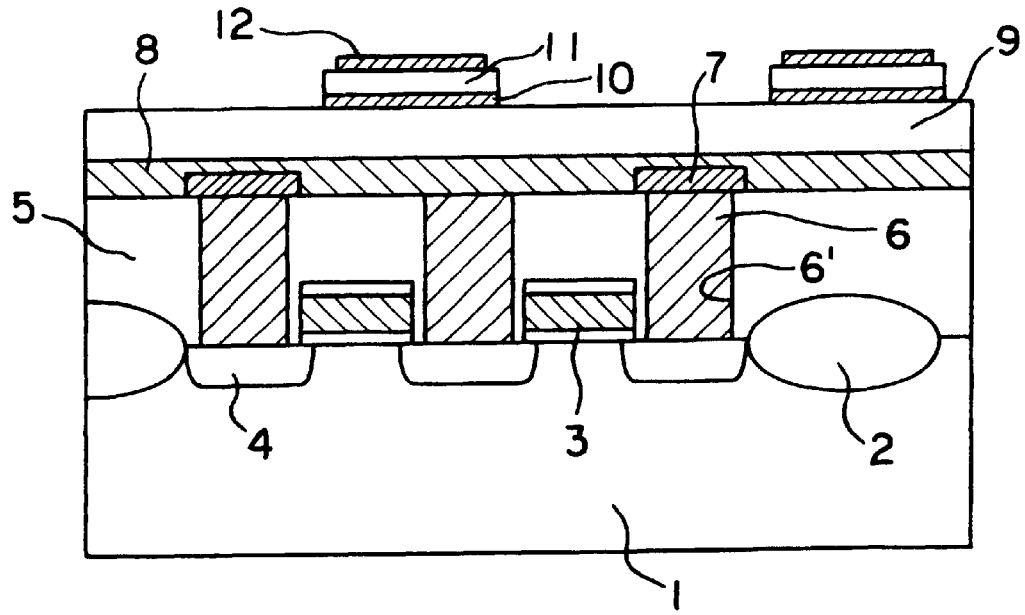
FIG. 12 is a sectional view showing a step of a process for manufacturing the memory cell of the conventional stacked semiconductor memory device of FIG. 9.

FIG. 8 is a sectional view showing the structure of the second preferred embodiment of a semiconductor device according to the present invention. Specifically, FIG. 8 is a sectional view showing the structure of the second preferred embodiment of a memory cell of a stacked semiconductor memory device using a ferroelectric or high-dielectric film for a capacitor, according to the present invention.

The construction of the second preferred embodiment of a memory cell of a stacked semiconductor memory device according to the present invention, which is shown in FIG. 8, is as follows. In the surface part of a silicon substrate 101, an element isolating film 102 for isolating element regions is formed every one memory cell, and three gate diffusion layers 104 are formed at regular intervals every one memory cell. On each of portions serving as channel regions between adjacent two of the gate diffusion layers 104 of the silicon substrate 101, the gate 103 of each of MOS transistors is formed so that the end portion of the gate 103 overlaps with the gate diffusion layers 104 arranged on both sides. A first interlayer insulator film 105 is formed on the silicon substrate 101, on which the gates 103 have been formed. A first contact holes 106' is formed in the first interlayer insulator film 105 above each of the gate diffusion layers 104. In each of the first contact holes 106', a first contact interconnection layer 106 is formed.

For each memory cell, a second interconnection layer 108 is connected to one of the three gate diffusion layers 104, which is commonly used for two of the MOS transistors, via a corresponding one of the first interconnection layers 106, and a first interconnection layer 107 is connected to each of two of the gate diffusion layers 104, each of which is dedicated for a corresponding one of two of the MOS transistors, via a corresponding one of the first interconnection layers 106. A second interlayer insulator film 109 is formed on the first interlayer insulator film 105, on which the first interconnection layer 107 and the second interconnection layer 108 have been formed. The surface of the second interlayer insulator film 109 is flattened. A second contact hole 114' is formed in each of portions of the second interlayer insulator film 109 above the first interconnection layers 107, and a second contact interconnection layer 114 is formed in each of the second contact holes 114'.

On the second interlayer insulator film 109, on which the second contact interconnection layers 114 has been formed in each of the second contact holes 114', there are formed capacitors, each of which has a capacitor bottom electrode 110, a capacitor insulator film 111 and a capacitor top electrode 112, so that each of the capacitors faces each of two of the three gate diffusion layers 104, each of which is dedicated for a corresponding one of two of the MOS transistors. Thus, the capacitor bottom electrode 110 of each of the capacitors is connected to the first interconnection layer 107 via the second contact interconnection layer 114. Furthermore, one or both of the capacitor bottom electrode 110 and the capacitor top electrode 112 may have a stacked structure.

A third interlayer insulator film 113 is formed on the second interlayer insulator film 109, on which the capacitors have been formed. On the surface of the third interlayer insulator film 113, the surface of the capacitor top electrode 112 is exposed. The surface of the third interlayer insulator film 113 is flattened so as to have substantially the same level as that of the surface of the capacitor top electrode 112.

A fourth interlayer insulator film 116 is formed on the flattened third interlayer insulator film 113. A fourth interconnection layer 118 of a multilayer interconnection layer is formed on the fourth interlayer insulator film 116. The capacitor top electrode 112 may be connected to the fourth interconnection layer 118 outside of the capacitor forming region, or may extend to the outside of the capacitor forming region to be connected to another interconnection layer. Moreover, an interconnection protecting insulator film 119 is formed on the whole surface of the fourth interlayer insulator film 116, on which the fourth interconnection layer 118 has been formed.

Similar to the first preferred embodiment of a stacked semiconductor memory device according to the present invention or the conventional stacked semiconductor memory device, the second preferred embodiment of a stacked semiconductor memory device according to the present invention, which is shown in FIG. 8, functions as a non-volatile memory, such as an EPROM and an EEPROM, when the capacitor insulator film 111 between the capacitor bottom electrode 110 and the capacitor top electrode 112 is formed of a ferromagnetic having a spontaneous dielectric polarization we no electric field is applied, and functions as a volatile memory, such as a DRAM, when the capacitor insulator film 111 is formed of a high-dielectric having a high dielectric.

The second preferred embodiment of a memory cell of a stacked semiconductor memory device according to the present invention, which is shown in FIG. 8, is produced by the following second preferred embodiment of a method for manufacturing a semiconductor device according to the present invention.

In the second preferred embodiment of a method for manufacturing a semiconductor device according to the present invention, the steps until the formation of the first interconnection layer 107 and the second interconnection layer 108 are the same as those in the first preferred embodiment of a method for manufacturing a semiconductor device according to the present invention.

After the first interconnection layer 107 and the second interconnection layer 108 are formed, a second interlayer insulator film 109 is deposited by the CVD method so as to have a thickness of, e.g., about 3000 angstroms, on the first interlayer insulator film 105, on which the first interconnection layer 107 and the second interconnection layer 108 have been formed. Then, the surface of the deposited second interlayer insulator film 109 is flattened by the CMP. After the surface of the second interlayer insulator film 109 is flattened, a second contact hole 114' is formed by the photolithography and RIE in a portion of the second interlayer insulator film 109 above the first interconnection layer 107.

After the second contact hole 114' is formed, an aluminum layer having a thickness of, e.g., about 4000 angstroms, is deposited by a sputtering method so as to be embedded in the second contact hole 114'. After the aluminum layer is deposited, the deposited aluminum layer is processed by the photolithography and the RIE so as to form a second contact interconnection layer 114 in the second contact hole 114'. In this case, since the surface of the second interlayer insulator film 109 has been flattened, it is possible to facilitate the formation and processing of the second contact interconnection layer 114 and upper multilayer interconnection layers.

After the second contact interconnection layer 114 is formed, a platinum film serving as a capacitor bottom electrode 110 is deposited by the sputtering method so as to have a thickness of, e.g., about 2000 angstroms, and a PZT film serving as a capacitor insulator film 111 is deposited thereon by the sputtering method so as to have a thickness of, e.g., about 3000 angstroms. Moreover, a platinum film serving as a capacitor top electrode 112 is deposited thereon by the sputtering method so as to have a thickness of, e.g., about 2000 angstroms. Furthermore, when the capacitor bottom electrode 110 and the capacitor top electrode 112 have a stacked structure, an SRO layer or a ruthenium layer is deposited after platinum film serving as the capacitor bottom electrode 110 is deposited, and an SRO layer or a ruthenium layer is deposited after the PZT film serving as the capacitor insulator film 111 is deposited. After the platinum film, the PZT film and the platinum film are sequentially formed, the capacitor top electrode 112 is formed by the photolithography and the RIE above the second contact interconnection layer 114. Thereafter, the capacitor insulator film 111 and the capacitor bottom electrode 110 are formed by the photolithography and the RIE.

After the capacitor having the capacitor top electrode 112, the capacitor insulator film 111 and the capacitor bottom electrode 110 is formed, a third interlayer insulator film 113 is deposited on the second interlayer insulator film 109, on which the capacitor has been formed, by the CVD method so as to have a thickness of, e.g., about 6000 angstroms. After the third interlayer insulator film 113 is deposited, the surface of the third interlayer insulator film 113 is flattened by, e.g., the CMP using the capacitor top electrode 112 as a stopper, so as to have substantially the same level as that of the surface of the capacitor top electrode 112 to expose the surface of the capacitor top electrode 112. Furthermore, although the flattening of the surface of the third interlayer insulator film 113 is preferably carried out by only the CMP, the flattening may be carried out by the combination of the CMP and etching. That is, after the flattening is carried out by the CMP until the third interlayer insulator film 113 slightly remain on the capacitor top electrode 112, the third interlayer insulator film 113 remaining on the capacitor top electrode 112 may be etched to be removed to expose the surface of the capacitor top electrode 112. In this case, the etching is more preferably the wet etching than the dry etching in view of the influence on the characteristics of the capacitor.

Thereafter, a fourth interlayer insulator film 116 is deposited on the flattened third interlayer insulator film 113 by the CVD so as to have a thickness of, e.g., about 3000 angstroms. After the forth interlayer insulator film 116 is deposited, aluminum having a thickness of, e.g., about 3000 angstroms, is deposited by the sputtering method to form a multilayer interconnection layer 118 by the photolithography and the RIE. Finally, an interconnection protecting insulator film 119 is deposited thereon by the CVD so as to have a thickness of, e.g., about 8000 angstroms. Thus, the second preferred embodiment of a memory cell of a stacked semiconductor memory device according to the present invention, which is shown in FIG. 8, is completed.

As described above, in the second preferred embodiment of a semiconductor device and a method for manufacturing the same according to the present invention, the interconnection drawn from the capacitor top electrode 112 is not formed by the formation of a contact hole and the embedding of a metal interconnection by the anisotropic etching, and the interlayer insulator film 109 is flattened by the CMP to form the capacitor bottom electrode 110 facing the contact interconnection layer 114 in the interlayer insulator film 109. Therefore, the anisotropic etching for forming the contact hole for forming the interconnection drawn from the capacitor top electrode 112 has no adverse influence on the capacitor top electrode 112, so that it is possible to easily form the interconnection connected to the capacitor top electrode 112 to obtain good capacitor characteristics. In addition, the interconnection connection from the capacitor bottom electrode 110 is formed without forming any contact holes in the interlayer insulator film 113 above the capacitor top electrode 112, and the interlayer insulator film 109 below the capacitor bottom electrode 110 and the interlayer insulator film 113 around the capacitor top electrode 112 are flattened. Therefore, the difference in level due to contact holes in upper layers above the capacitor top electrode 112 can be removed, so that the conventional difficulty of processing the multilayer structure due to the difference in level can be reduced.

In addition, in the second preferred embodiment of a semiconductor device and a method for manufacturing the same according to the present invention, the contact interconnection layer 114 is connected to the whole surface of the capacitor bottom electrode 110, so that the contact resistance between the capacitor bottom electrode 110 and the multilayer interconnection layer can be decreased. Moreover, the allowable range of alignment precise in the manufacturing process can be very large, and the difference in level due to contact holes in upper layers above the capacitor top electrode 112 can be removed, so that the processing of the interconnection can be easily carried out to be suitable for the high density integration of a semiconductor device.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:
   a first interlayer insulator film formed as one of a plurality of layers stacked on a semiconductor substrate;
   a capacitor formed on the first interlayer insulator film, the capacitor having a capacitor bottom electrode, a capacitor top electrode and a capacitor insulator film arranged between the capacitor bottom electrode and the capacitor top electrode;
   a second interlayer insulator film formed on the first interlayer insulator film, on which the capacitor is formed, the second interlayer insulator film having a surface which has the same level as that of a surface of the capacitor top electrode;
   a contact interconnection layer formed in a contact hole formed in the first and second interlayer insulator films, the contact interconnection layer being electrically connected to a layer below the first interlayer insulator film; and
   a capacitor interconnection layer formed in a portion including a part or all of a top surface of the contact interconnection layer on the second interlayer insulator film and a part or all of a surface of the capacitor top electrode, the capacitor interconnection layer electrically connecting the capacitor top electrode with the contact interconnection layer.

2. The semiconductor device as set forth in claim 1, wherein the capacitor insulator film is formed of a ferroelectric or a high-dielectric.

3. The semiconductor device as set forth in claim 2, wherein the capacitor insulator film includes PZT (Lead (Pb) Zirconate Titanate).

4. The semiconductor device as set forth in claim 1, wherein one or both of the capacitor bottom electrode and the capacitor top electrode have a stacked structure.

5. A semiconductor device comprising:
   a first interlayer insulator film formed as one of a plurality of layers stacked on a semiconductor substrate;
   a capacitor formed on said first interlayer insulator film, said capacitor having a capacitor bottom electrode, a capacitor top electrode and a capacitor insulator film arranged between said capacitor bottom electrode and said capacitor top electrode;
   a second interlayer insulator film formed on said first interlayer insulator film, on which said capacitor is formed, said second interlayer insulator film having a surface which has the same level as that of a surface of said capacitor top electrode;
   a contact interconnection layer formed in a contact hole formed in said first and second interlayer insulator films, said contact interconnection layer being electrically connected to a layer below said first interlayer insulator film; and
   a capacitor interconnection layer formed in a portion including a part or all of a top surface of said contact interconnection layer on said second interlayer insulator film and a part or all of a surface of said capacitor top electrode.

6. The semiconductor device as set forth in claim 5, wherein a MOS transistor is formed in the surface part of the semiconductor substrate.

7. A semiconductor device comprising:
   a first interlayer insulator film formed as one of a plurality of layers stacked on a semiconductor substrate;
   a capacitor formed on the first interlayer insulator film, the capacitor having a capacitor bottom electrode, a capacitor top electrode and a capacitor insulator film arranged between the capacitor bottom electrode and the capacitor top electrode;
   a second interlayer insulator film formed on the first interlayer insulator film, on which the capacitor is formed, the second interlayer insulator film having a surface which is flattened to expose a surface of the capacitor top surface;
   a contact interconnection layer formed in a contact hole formed in the first and second interlayer insulator films, the contact interconnection layer being electrically connected to a layer below the first interlayer insulator film; and
   a capacitor interconnection layer formed in a portion including a part or all of a top surface of the contact interconnection layer on the second interlayer insulator film and a part or all of a surface of the capacitor top electrode.

8. At The semiconductor device as set forth in claim 7, wherein a MOS transistor is formed in the surface part of the semiconductor substrate, and the layer below the first interlayer insulator film serves as a gate diffusion layer of the MOS transistor.

9. The semiconductor device as set forth in claim 7, wherein the first interlayer insulator film has a flattened surface, and
   which further comprises a contact interconnection layer formed in a contact hole formed in the first interlayer insulator film, the contact interconnection layer being electrically connected to a layer below the first interlayer insulator film,
   the capacitor being formed in a portion including a part or all of a top surface of the contact interconnection layer on the first interlayer insulator film.

10. The semiconductor device as set forth in claim 9, wherein a MOS transistor is formed in the surface part of the semiconductor substrate, and the layer below the first interlayer insulator film serves as a gate diffusion layer of the MOS transistor.

11. A semiconductor device comprising:
   a first interlayer insulator film formed as one of a plurality of layers stacked on a semiconductor substrate, on which a MOS transistor for memory cell is formed;
   a capacitor formed on the first interlayer insulator film, the capacitor having a capacitor bottom electrode, a capacitor top electrode and a capacitor insulator film arranged between the capacitor bottom electrode and the capacitor top electrode;
   a second interlayer insulator film formed on the first interlayer insulator film on which the capacitor is formed, the second interlayer insulator film having a surface which has the same level as that of a surface of the capacitor top electrode;
   a contact interconnection layer formed in a contact hole formed in the first and second interlayer insulator films, the contact interconnection layer being electrically connected to a layer below the first interlayer insulator film; and
   a capacitor interconnection layer formed in a portion including a part or all of a top surface of the contact interconnection layer on the second interlayer insulator film and a part or all of a surface of the capacitor top electrode.

12. A semiconductor device as set forth in claim 11, wherein the capacitor insulator film is formed of a ferroelectric or a high-dielectric.

13. A semiconductor device as set forth in claim 12, wherein the capacitor insulator film includes PZT.

14. A semiconductor device as set forth in claim 11, wherein one or both of the capacitor bottom electrode and the capacitor top electrode have a stacked structure.

15. A semiconductor device comprising:
   a first interlayer insulator film formed as one of a plurality of layers stacked on a semiconductor substrate, on which a MOS transistor for memory cell is formed,
   a capacitor formed on the first interlayer insulator film the capacitor having a capacitor bottom electrode, a capacitor top electrode and a capacitor insulator film arranged between the capacitor bottom electrode and the capacitor top electrode;
   a second interlayer insulator film formed on the first interlayer insulator film, on which the capacitor is formed, the second interlayer insulator film having a surface which is flattened to expose a surface of the capacitor top electrode;
   a contact interconnection layer formed in a contact hole formed in the first and second interlayer insulator films, the contact interconnection layer being electrically connected to a layer below the first interlayer insulator film; and
   a capacitor interconnection layer formed in a portion including a part or all of a top surface of the contact interconnection layer on the second interlayer insulator film and a part or all of a surface of the capacitor top electrode.

16. A semiconductor device as set forth in claim 15, wherein the capacitor insulator film is formed of a ferroelectric or a high-dielectric.

17. A semiconductor device as set forth in claim 16, wherein the capacitor insulator film includes PZT.

18. A semiconductor device as set forth in claim 15, wherein one or both of the capacitor bottom electrode and the capacitor top electrode have a stacked structure.

19. A semiconductor device comprising:
- a first interlayer insulator film formed as one of a plurality of layers stacked on a semiconductor substrate, on which a MOS transistor for memory cell is formed, the first interlayer insulator film has a flattened surface;
- a first contact interconnection layer formed in a contact hole formed in the first interlayer insulator film, the first contact interconnection layer being electrically connected to a gate diffusion layer of the MOS transistor;
- a capacitor being formed in a portion including a part or all of a top surface of the first contact interconnection layer on the first interlayer insulator film, the capacitor having a capacitor bottom electrode, a capacitor top electrode and a capacitor insulator film arranged between the capacitor bottom electrode and the capacitor top electrode;
- a second interlayer insulator film formed on the first interlayer insulator film, on which the capacitor is formed, the second interlayer insulator film having a surface which is flattened to expose a surface of the capacitor top electrode;
- a second contact interconnection layer formed in a contact hole formed in the first and second interlayer insulator films, the second contact interconnection layer being electrically connected to a layer below the first interlayer insulator film; and
- a capacitor interconnection layer formed in a portion including a part or all of a top surface of the second contact interconnection layer on the second interlayer insulator film and a part or all of a surface of the capacitor top electrode, the capacitor interconnection layer electrically connecting the capacitor top electrode with the second contact interconnection layer.

20. A semiconductor device as set forth in claim 19, wherein the capacitor insulator film is formed of a ferroelectric or a high-dielectric.

21. A semiconductor device as set forth in claim 20, wherein the capacitor insulator film includes PZT.

22. A semiconductor device as set forth in claim 19, wherein one or both of the capacitor bottom electrode and the capacitor top electrode have a stacked structure.

23. A semiconductor device comprising:
- a first interlayer insulator film formed as one of a plurality of layers stacked on a semiconductor substrate, on which a MOS transistor for memory cell is formed, the first interlayer insulator film has a flattened surface;
- a first contact interconnection layer formed in a contact hole formed in the first interlayer insulator film, the first contact interconnection layer being electrically connected to a gate diffusion layer of the MOS transistor;
- a capacitor being formed in a portion including a part or all of a top surface of the first contact interconnection layer on the first interlayer insulator film, the capacitor having a capacitor bottom electrode, a capacitor top electrode and a capacitor insulator film arranged between the capacitor bottom electrode and the capacitor top electrode;
- a second interlayer insulator film formed on the first interlayer insulator film, on which the capacitor is formed, the second interlayer insulator film having a surface which has the same level as that of a surface of the capacitor top electrode;
- a second contact interconnection layer formed in a contact hole formed in the first and second interlayer insulator films, the second contact interconnection layer being electrically connected to a layer below the first interlayer insulator film; and
- a capacitor interconnection layer formed in a portion including a part or all of a top surface of the second contact interconnection layer on the second interlayer insulator film and a part or all of a surface of the capacitor top electrode, the capacitor interconnection layer electrically connecting the capacitor top electrode with the second contact interconnection layer.

24. A semiconductor device as set forth in claim 23, wherein the capacitor insulator film is formed of a ferroelectric or a high-dielectric.

25. A semiconductor device as set forth in claim 24, wherein the capacitor insulator film includes PZT.

26. A semiconductor device as set forth in claim 23, wherein one or both of the capacitor bottom electrode and the capacitor top electrode have a stacked structure.

27. A semiconductor device comprising:
- a first interlayer insulator film formed as one of a plurality of layers stacked on a semiconductor substrate, on which a MOS transistor for memory cell is formed;
- a capacitor formed on the first interlayer insulator film, the capacitor having a capacitor bottom electrode, a capacitor top electrode and a capacitor insulator film arranged between the capacitor bottom electrode and the capacitor top electrode;
- a second interlayer insulator film formed on the first interlayer insulator film, on which the capacitor is formed, the second interlayer insulator film having a surface which is flattened to expose a surface of the capacitor top electrode;
- a contact interconnection layer formed in a contact hole formed in the first and second interlayer insulator films, the second contact interconnection layer being electrically connected to a layer below the first interlayer insulator film; and
- a capacitor interconnection layer formed in a portion including a part or all of a top surface of the second contact interconnection layer on the second interlayer insulator film and a part or all of a surface of the capacitor top electrode, the capacitor interconnection layer electrically connecting the capacitor top electrode with the second contact interconnection layer.

28. A semiconductor device as set forth in claim 27, wherein the capacitor insulator film is formed of a ferroelectric or a high-dielectric.

29. A semiconductor device as set forth in claim 28, wherein the capacitor insulator film includes PZT.

30. A semiconductor device as set forth in claim 27, wherein one or both of the capacitor bottom electrode and the capacitor top electrode have a stacked structure.

31. A semiconductor device comprising:
- a first interlayer insulator film formed as one of a plurality of layers stacked on a semiconductor substrate, on which a MOS transistor for memory cell is formed;
- a capacitor formed on the first interlayer insulator film, the capacitor having a capacitor bottom electrode, a capacitor top electrode and a capacitor insulator film arranged between the capacitor bottom electrode and the capacitor top electrode;
- a second interlayer insulator film formed on the first interlayer insulator film, on which the capacitor is formed, the second interlayer insulator film having a surface which is flattened to expose a surface of the capacitor top electrode;

a contact interconnection layer formed in a contact hole formed in the first and second interlayer insulator films, the second contact interconnection layer being electrically connected to a layer below the first interlayer insulator film:, and a capacitor interconnection layer formed on the second interlayer insulator film so as to be electrically connected to the capacitor top electrode and the contact interconnection layer, the capacitor interconnection layer having a cross-sectional width which is equal to the maximum distance between a side of the capacitor top electrode and a side of the contact interconnection layer or is longer than the maximum distance.

32. A semiconductor device as set forth in claim 31, wherein the capacitor insulator film is formed of a ferroelectric or a high-dielectric.

33. A semiconductor device as set forth in claim 31, wherein one or both of the capacitor bottom electrode and the capacitor top electrode have a stacked structure.

34. A semiconductor device as set forth in claim 31, wherein one or both of the capacitor bottom electrode and the capacitor top electrode have a stacked structure.

35. A semiconductor device comprising:

a first interlayer insulator film formed as one of a plurality of layers stacked on a semiconductor substrate;

a capacitor formed on the first interlayer insulator film, the capacitor having a capacitor bottom electrode, a capacitor top electrode and a capacitor insulator film arranged between the capacitor bottom electrode and the capacitor top electrode;

a second interlayer insulator film formed on the first interlayer insulator film, on which the capacitor is formed, the second interlayer insulator film having a surface which has the same level as that of a surface of the capacitor top electrode;

a capacitor interconnection layer formed in a portion including a part or all of a surface of the capacitor top electrode;

a third interlayer insulator film formed on the second interlayer insulator film, on which the capacitor interconnection layer is formed; and a contact interconnection layer formed in a contact hole formed in the third interlayer insulator film, the contact interconnection layer being formed on a portion including a part or all of a top surface of the capacitor interconnection layer, the contact interconnection layer being electrically connected to the capacitor top electrode via the capacitor interconnection layer.

36. The semiconductor device as set forth in claim 35, wherein the capacitor insulator film is formed of a ferroelectric or a high-dielectric.

37. The semiconductor device as set forth in claim 36, wherein the capacitor insulator film includes PZT (Lead (Pb) Zirconate Titanate).

38. The semiconductor device as set forth in claim 35, wherein one or both of the capacitor bottom electrode and the capacitor top electrode have a stacked structure.

39. A semiconductor device comprising:

a first interlayer insulator film formed as one of a plurality of layers stacked on a semiconductor substrate;

a capacitor formed on the first interlayer insulator film, the capacitor having a capacitor bottom electrode, a capacitor top electrode and a capacitor insulator film arranged between the capacitor bottom electrode and the capacitor top electrode;

a second interlayer insulator film formed on the first interlayer insulator film, on which the capacitor is formed, the second interlayer film having a surface which is flattened to expose a surface of the capacitor top electrode;

a capacitor interconnection layer formed in a portion including a part or all of a surface of the capacitor top electrode;

a third interlayer insulator film formed on the second interlayer insulator film, on which the capacitor interconnection layer is formed; and a contact interconnection layer formed in a contact hole formed in the third interlayer insulator film, the contact interconnection layer being formed on a portion including a part or all of a top surface of the capacitor interconnection layer, the contact interconnection layer being electrically connected to the capacitor top electrode via the capacitor interconnection layer.

40. The semiconductor device as set forth in claim 39, wherein the capacitor insulator film is formed of a ferroelectric or a high-dielectric.

41. The semiconductor device as set forth in claim 40, wherein the capacitor insulator film includes PZT (Lead (Pb) Zirconate Titanate).

42. The semiconductor device as set forth in claim 39, wherein one or both of the capacitor bottom electrode and the capacitor top electrode have a stacked structure.

* * * * *